United States Patent [19]
Hutter et al.

[11] Patent Number: 5,614,755
[45] Date of Patent: Mar. 25, 1997

[54] HIGH VOLTAGE SHOTTKY DIODE

[75] Inventors: Louis N. Hutter, Richardson, Tex.; Marco Corsi, Bedford, England

[73] Assignee: Texas Instruments Incorporated, Dallas, Tex.

[21] Appl. No.: 56,446

[22] Filed: Apr. 30, 1993

[51] Int. Cl.$^6$ .......................... H01L 29/872; H01L 29/72
[52] U.S. Cl. .......................... 257/471; 257/476; 257/484
[58] Field of Search .................... 257/471, 474, 257/476, 477, 478–480, 481, 483, 484, 155, 928, 603

[56] References Cited

U.S. PATENT DOCUMENTS

| | | | |
|---|---|---|---|
| 3,906,540 | 9/1975 | Hollins | 257/476 |
| 4,062,033 | 12/1977 | Suzuki | 257/474 |
| 4,825,275 | 4/1989 | Tomassetti | 357/43 |
| 4,912,054 | 2/1990 | Tomassetti | 437/31 |
| 4,965,643 | 10/1990 | Freeman | 257/476 |
| 5,034,337 | 7/1991 | Mosher et al. | 437/31 |
| 5,060,044 | 10/1991 | Tomassetti | 357/43 |
| 5,087,579 | 2/1992 | Tomassetti | 357/43 |
| 5,148,241 | 9/1992 | Sugita | 257/603 |
| 5,153,697 | 10/1992 | Mosher et al. | 357/43 |

FOREIGN PATENT DOCUMENTS

| | | | |
|---|---|---|---|
| 0275179 | 7/1988 | European Pat. Off. | 257/484 |
| 0113277 | 7/1982 | Japan | 257/479 |

*Primary Examiner*—Peter Toby Brown
*Attorney, Agent, or Firm*—W. James Brady, III; Richard L. Donaldson

[57] ABSTRACT

A high operating voltage bipolar transistor (42) includes a base including a first region (52) of a lightly doped layer (44) of semiconductor material of a first conductivity type. The transistor (42) also includes a collector including a buried layer (50) and a collector region (48). The lightly doped layer (44) is formed over the buried layer (50) and the collector region (48) extends through the lightly doped layer (44) and contacts the buried layer (50). The transistor (42) also includes an emitter formed in the base. The transistor (42) provides a high operating voltage without requiring an increased thickness epitaxial layer or additional processing steps. A high Hfe transistor and high voltage Schottky diode are also described.

5 Claims, 16 Drawing Sheets

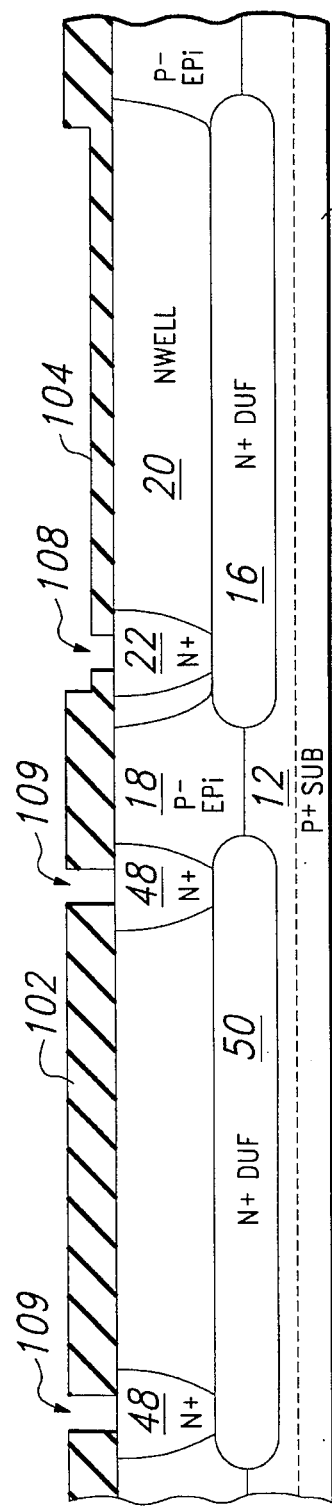
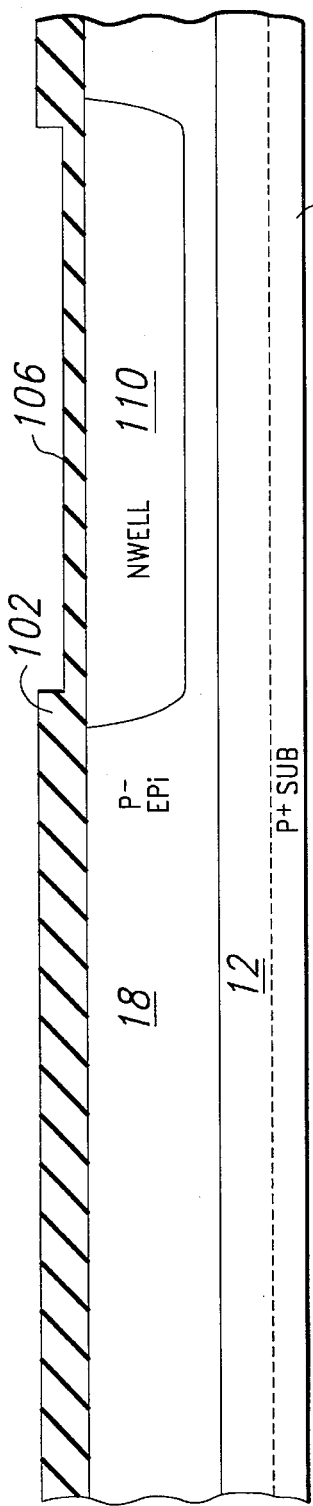
Fig. 12a
Fig. 12b

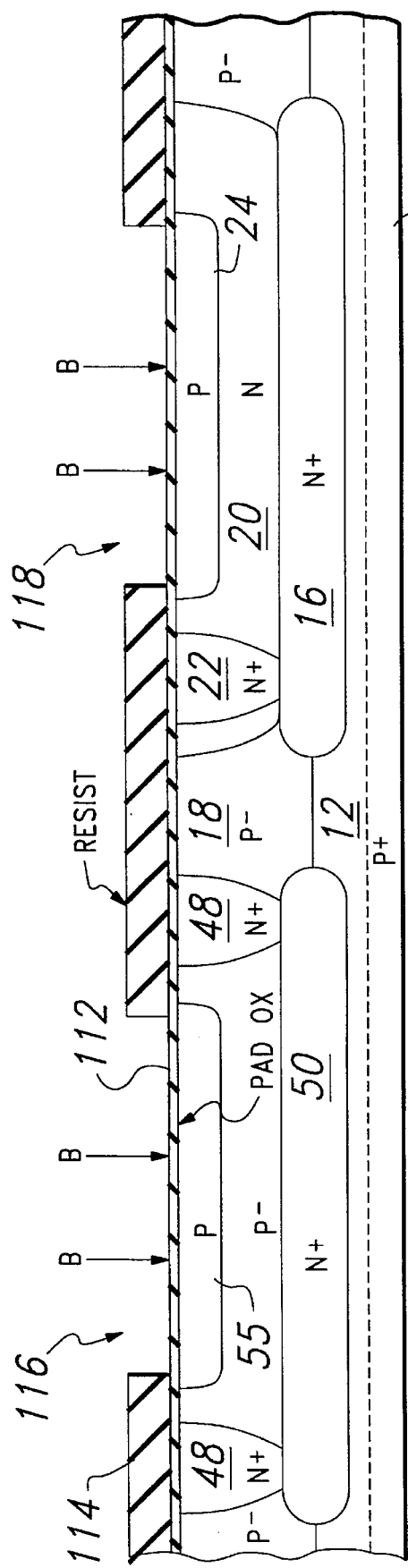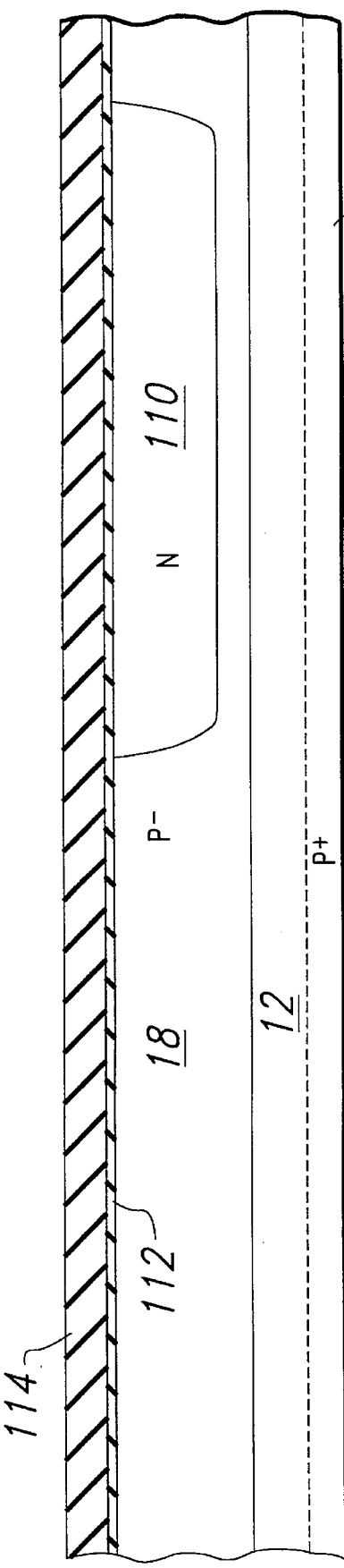
Fig. 13a
Fig. 13b

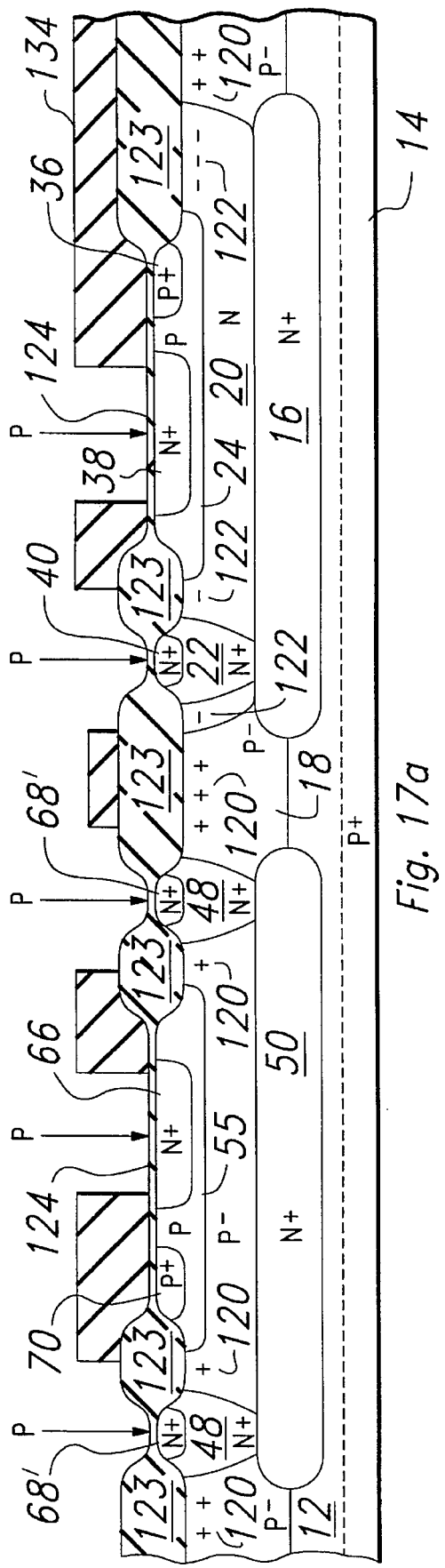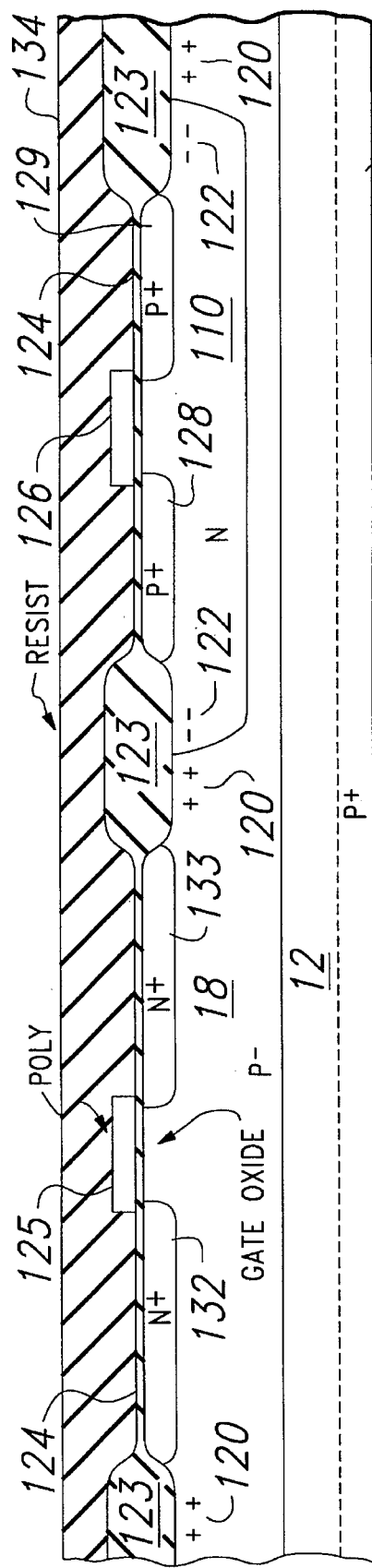
Fig. 17a
Fig. 17b

HIGH VOLTAGE SHOTTKY DIODE

FIELD OF THE INVENTION

This invention relates generally to semiconductor devices and methods of fabrication thereof and, more particularly, to high voltage semiconductor devices, high beta semiconductor devices, and methods of fabrication thereof.

BACKGROUND OF THE INVENTION

It is often necessary in linear mixed-signal BiCMOS processes to mix low and high voltage components. Components selected for use in high voltage sections of a BiCMOS integrated circuit must have a high voltage capability or potential operating voltage. Bipolar devices are typically selected as the high voltage components due to their superior voltage handling ability in comparison to conventional MOS devices.

The voltage capability of a bipolar transistor is usually measured in terms of the open-base collector-emitter breakdown voltage, BVceo. The BVceo breakdown voltage is related to the current gain of a bipolar transistor through the following empirical relationship:

1.) $BVceo = BVcbo(bulk)/(Hfe)^{1/n}$ where:

BVcbo(bulk)=planar base-collector breakdown voltage at the bottom of the base-collector junction;
Hfe=current gain of the transistor; and
n=an empirical constant typically in the range of 3–6.

The voltage capability of a bipolar transistor can be increased by increasing its BVceo breakdown voltage. A conventional technique for increasing BVceo breakdown voltage is to increase the thickness of the epitaxial layer in which the transistor is fabricated. Increasing the thickness of the epitaxial layer increases the BVcbo(bulk) breakdown voltage which, as seen from Equation 1 above, increases the BVceo breakdown voltage.

A drawback to the use of increased epitaxial layer thickness in an integrated circuit to increase voltage capability is the fact that all components in the integrated circuit, including any low-voltage bipolar transistors and CMOS devices, must be fabricated in the thicker epitaxial layer. In BiCMOS processes using a standard cell design approach based on devices characterized for an epitaxial layer of conventional thickness, increasing the thickness of the epitaxial layer is unacceptable. This is due to the fact that increasing epitaxial layer thickness requires scaling all devices to larger dimensions which in turn requires recharacterization or redesign of low-voltage cells already in the standard cell library.

For NPN transistors formed in an Nwell there is an additional drawback to the use of an epitaxial layer of increased thickness. In these NPN transistors, the Nwell must extend completely through a P epitaxial layer and contact a buried N+ collector layer. The additional drawback results from the fact that the formation of an N well that extends through the P epitaxial layer to the buried N+ collector layer becomes progressively more difficult with increasing thickness of the epitaxial layer.

Another conventional technique for increasing BVceo breakdown voltage for NPN transistors is to reduce the dopant concentration of the Nwell in which they are formed. Reduced dopant concentration results in an increase in the empirical constant n in equation 1 above which in turn results in an increase in BVceo breakdown voltage. A drawback to this technique is that many low voltage Nwell devices in the standard cell library cannot accept such a reduced dopant concentration. As a result, this technique requires additional process steps since separate implants must be performed for low voltage Nwell devices having a standard dopant concentration and for high voltage Nwell NPN transistors having a reduced dopant concentration.

A need therefore exists for a process that increases the voltage capability of a bipolar transistor without increasing the thickness of the epitaxial layer or requiring extra process steps.

Bipolar transistors having high current gain or Hfe are also required in certain BiCMOS processes. A conventional technique for increasing Hfe is to make the base width extremely narrow in order to increase integrated base charge. One drawback to this technique is that extremely narrow base widths are very difficult to precisely control. Consequently, the actual Hfe values for transistors fabricated using this technique cannot be very accurately predicted. Another drawback is that relatively low voltages will punch through such extremely narrow width base regions.

A need therefore exists for a process that increases the Hfe of a bipolar transistor without using extremely narrow base widths.

BRIEF DESCRIPTION OF THE DRAWINGS

In the drawings:

FIG. 10–18 are cross-sectional elevation views of a BiCMOS device incorporating the transistor of FIG. 5 and conventional NPN, NMOS, and PMOS transistors at successive stages during fabrication;

Corresponding numerals and symbols in the different figures refer to corresponding parts unless otherwise indicated.

DETAILED DESCRIPTION OF PREFERRED EMBODIMENTS

Figure 1:
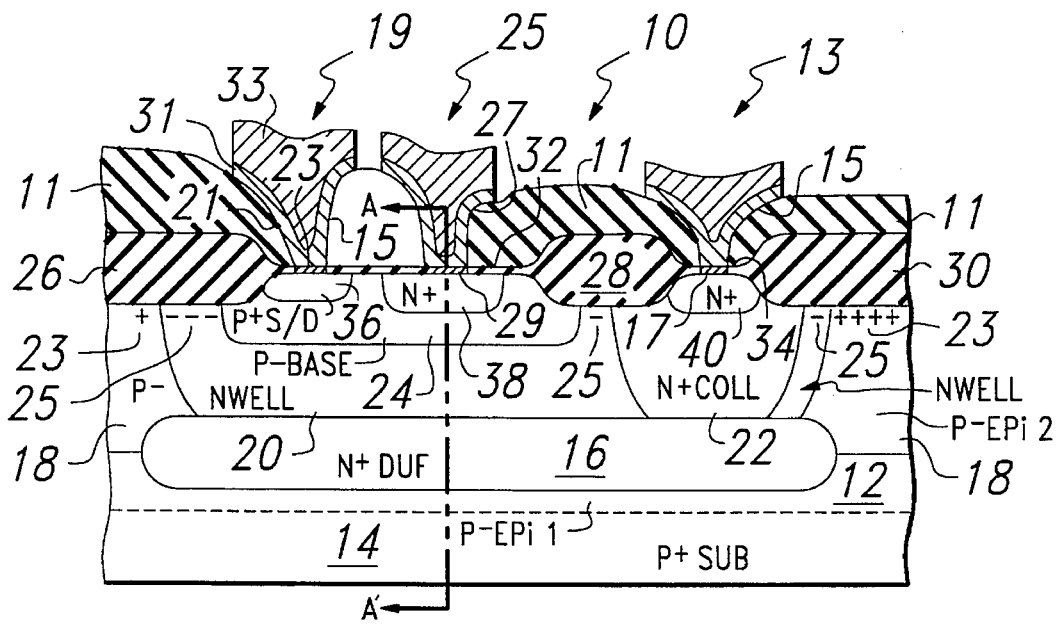
FIG. 1 is a cross-sectional elevation view of an NPN transistor fabricated in an Nwell according to the prior art.

FIG. 1 shows a cross-section of an NPN transistor 10 according to the prior art fabricated using a conventional Nwell BiCMOS process. Transistor 10 is formed in P− epitaxial layers 12 and 18. Epitaxial layer 18 is formed over epitaxial layer 12 which in turn is formed over P+ substrate 14. Transistor 10 includes an Nwell region 20 that extends through P− epitaxial layer 18 and contacts buried N+ collector layer 16 (also known as a DUF or diffusion under film) which is formed at the interface of epitaxial layers 12 and 18.

An N+ collector region 22 and P− base region 24 are formed in Nwell 20. Field oxide regions 26, 28, and 30 are formed over n channel stop regions 25 (denoted by "−" signs) and p channel stop regions 23 (denoted by "+" signs) in P− epitaxial layer 18 and gate oxide layers 32 and 34 are formed between field oxide regions 26, 28, and 30. P+ base contact region 36 is formed in base region 24 and N+ emitter region 38 and N+ collector contact region 40 in N+ collector region 22.

A doped glass layer (MLO) 11 extends over field oxide regions 26, 28, and 30 and over thin oxide layers 32 and 34. Collector contact 13 extends through opening 15 in doped glass layer 11 and contacts platinum silicide layer 17 formed at the face of collector contact region 40. Base contact 19 extends through opening 21 in doped glass layer 11 and contacts platinum silicide layer 23 formed at the face of base contact region 36. Emitter contact 25 extends through opening 27 in oxide layer 11 and contacts platinum silicide layer 29 formed at the face of emitter region 38. Contacts 13, 19, and 25 are formed with a first layer 31 of TiW and a second layer 33 of Al-Si-Cu formed over first layer 31.

As seen in FIG. 1, transistor 10 uses a conventional collector-diffused isolation (CDI) process in which the collector region formed by Nwell 20 and buried N+ collector layer 16 is self-isolating in the surrounding P− type material of epitaxial layers 12 and 18. Base region 24 in NPN transistor 10 is formed entirely in N well 20 so that the base-collector p-n junction is located solely between P− base region 24 and Nwell 20.

Figure 2:
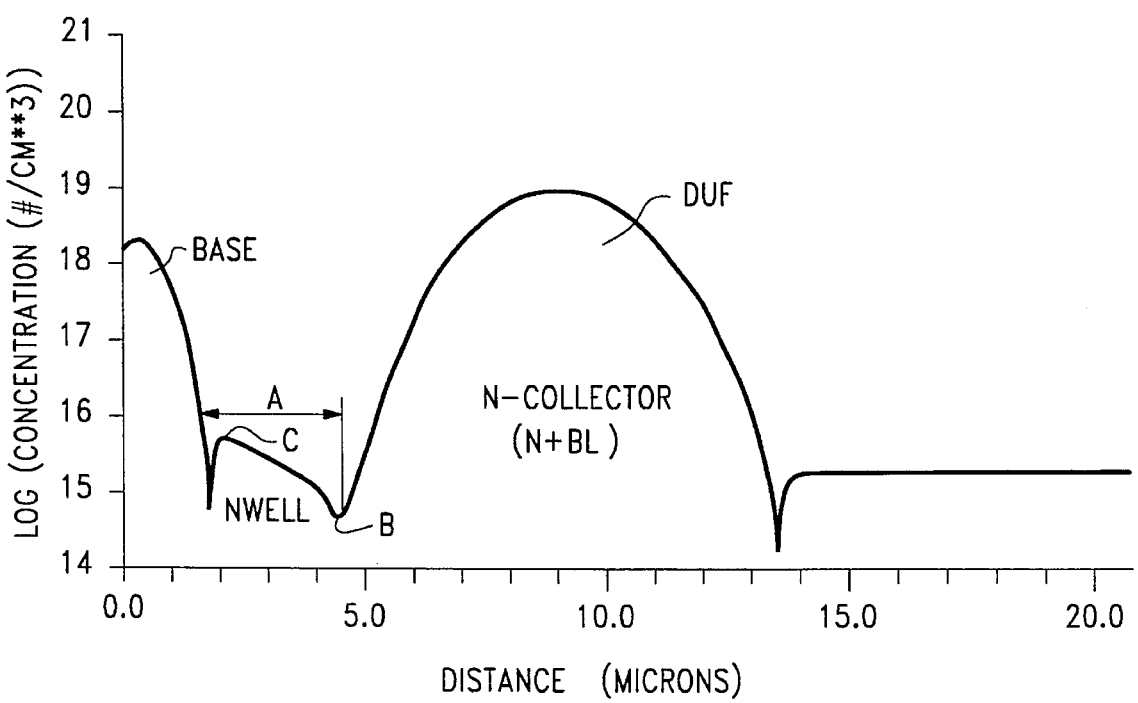
FIG. 2 is a graph showing doping profiles of the net Nwell, N+ buried layer, and base taken along section lines A—A' of the transistor of FIG. 1.

FIG. 2 is a graph showing a conventional doping profile of base region 24, Nwell 20, and N+ buried layer 16 for transistor 10 of FIG. 1 in terms of concentration in atoms/cm$^3$ versus distance in microns from thin oxide layer 32 for an epitaxial layer 18 having a thickness of 9 microns. As seen in FIG. 2, the collector-base junction depth is approximately 1.7 microns so as to maintain relatively high radius-of-curvature limited base-collector breakdown voltage, BVcbo. The portion of the curve labelled A graphically represents the dopant concentration of the Nwell from the interface between the base region 24 and Nwell 20 to the interface between Nwell 20 and N+ buried collector layer 16.

As seen in FIG. 2, as the distance from the upper surface of Nwell 20 near the interface between base region 24 and Nwell 20 increases, the dopant concentration decreases. At point B, which is the interface between Nwell 20 and N+ buried collector layer 16 approximately 4.5 microns from thin oxide layer 32, the dopant concentration is markedly less than that at point C which is near the upper surface of Nwell 20.

Increasing the thickness of epitaxial layer 18 beyond 9 microns increases the width of Nwell 20 beyond that shown in FIG. 2 and results in the dopant concentration at the interface between Nwell 20 and N+ buried collector layer 16 decreasing below point B. The formation of N well 20 extending through P− epitaxial layer 18 to the buried N+ collector layer 16 thus becomes progressively more difficult as the thickness of epitaxial layer 18 increases. At some thickness of epitaxial layer 18, effective electrical contact between the Nwell region 20 and N+ buried layer 16 would no longer exist thus degrading the performance of transistor 10. This is one drawback to the technique of increasing the operating voltage of transistor 10 by increasing the thickness of epitaxial layer 18.

Increasing the thickness of epitaxial layer 18 also results in increased lateral diffusion of regions, such as Nwell 20 and N+ collector region 22, that extend through epitaxial layer 18. To compensate for the increased lateral diffusion, the lateral spacing design rules must also be increased even for devices that will not have high operating voltages. For processes using a standard cell design approach, an increase in thickness of the epitaxial layer to increase operating voltage thus requires recharacterization or redesign of low-voltage cells in the standard cell library. This is another drawback to the technique of increasing the operating voltage of transistor 10 by increasing the thickness of epitaxial layer 18.

Figure 3:
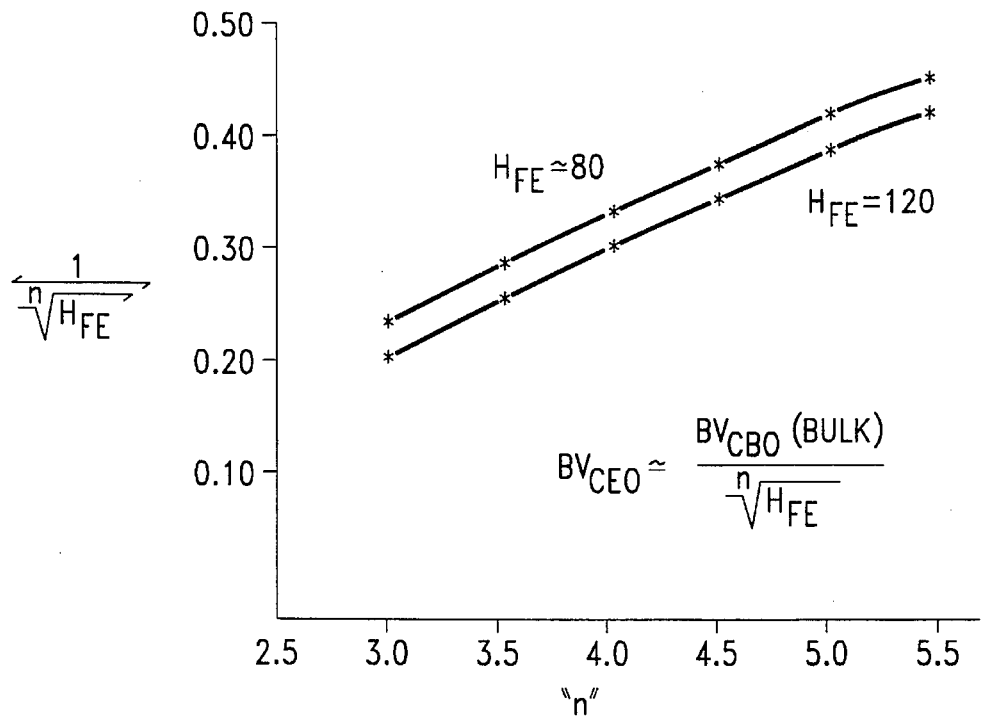
FIG. 3 is a graph showing empirical "n" values as a function of collector-base voltage for several different Nwell implant doses for the transistor of FIG. 1.

FIG. 3 is a graph illustrating the impact of the empirical constant n on the value of $1/(Hfe)^{1/n}$ from Equation 1 for transistors with an Hfe of 80 and transistors with an Hfe of 120. For an Hfe of either 80 or 120, as the value of n increases, the value of $1/(Hfe)^{1/n}$ also increases. As is apparent from Equation 1, the larger the value of $1/(Hfe)^{1/n}$, the larger the BVceo breakdown voltage.

Figure 4:
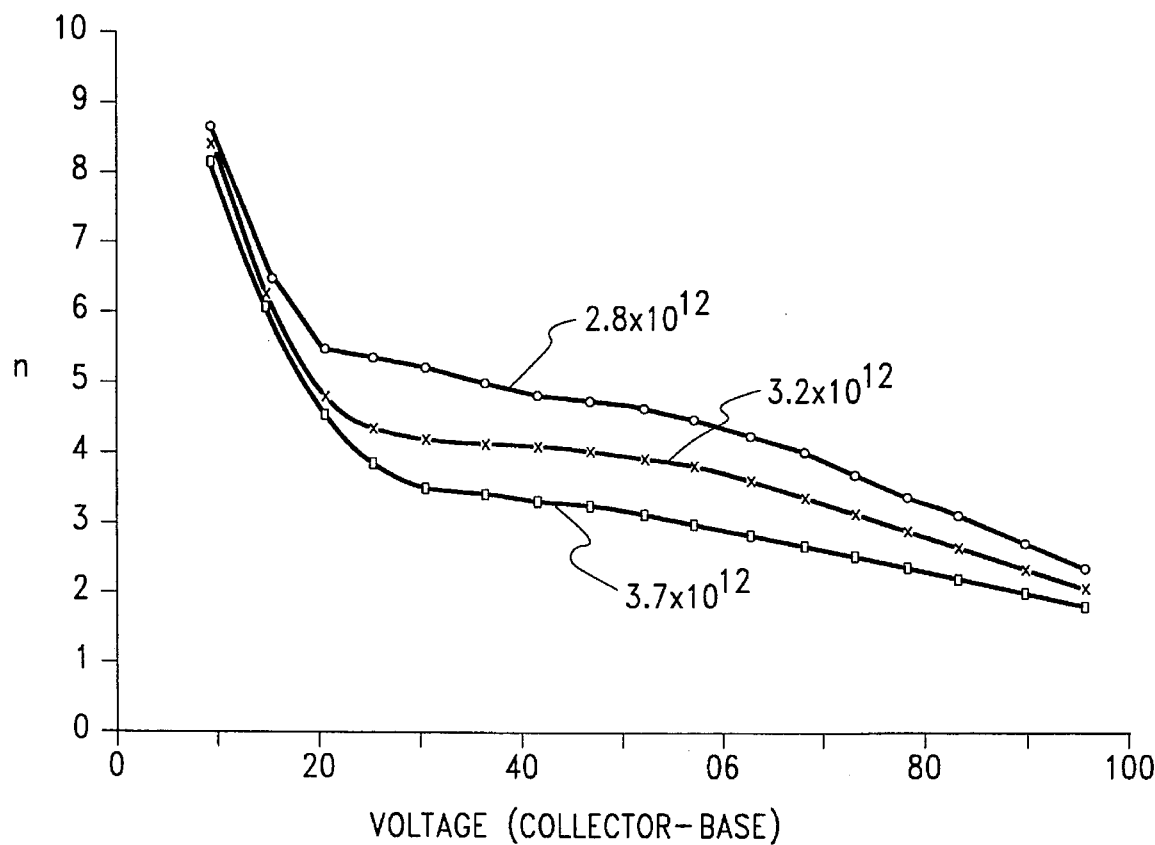
FIG. 4 is a graph showing $(Hfe)^{1/n}$ as a function of n for several values of Hfe.

FIG. 4 is a graph illustrating the estimated value of the empirical constant n as a function of collector-base voltage for Nwell implant doses of 3.7E12, 3.2E12, and 2.8E12 atoms/cm$^2$ with a base implant dose of 1.0E14 atoms/cm$^2$, an Pepi doping of 2.0E15 atoms/cm$^8$, a second epitaxial layer thickness of 8.5 microns and a pre-epi Si etch of 0.15 microns. For typical collector-base operating voltages in the range of 20–40 volts, the empirical constant n is approximately constant at a value of about 3.5. For a typical BVcbo(bulk) of approximately 92 volts, the BVceo for transistor 10 can be estimated from equation 1 at approximately 28 volts for a typical Hfe of 80 and at approximately 24 volts for an Hfe of 120.

For typical collector-base operating voltages in the range of 20–40 volts, the lower Nwell implant dose of 2.8E12 atoms/cm$^2$ has a significantly higher empirical constant n than implant doses of 3.2E12 or 3.7E12 atoms/cm$^2$. A conventional technique for increasing BVceo breakdown voltage is to use a low dose implant, such as 2.8E12, in Nwells in which high operating voltage NPN transistors are formed.

As seen in FIG. 4, this results in an increase in the empirical constant n which in turn results in an increase in BVceo breakdown voltage. However, in processes using a standard cell design approach, many low voltage cells in the standard cell library require a higher dose implant, such as 3.7E12 atoms/cm². As a result, this technique requires separate Nwell implants be performed for low voltage cells and high operating voltage NPN transistors. The additional process steps resulting from the separate Nwell implants are a drawback to this technique of increasing BVceo operating voltage.

Figure 5:
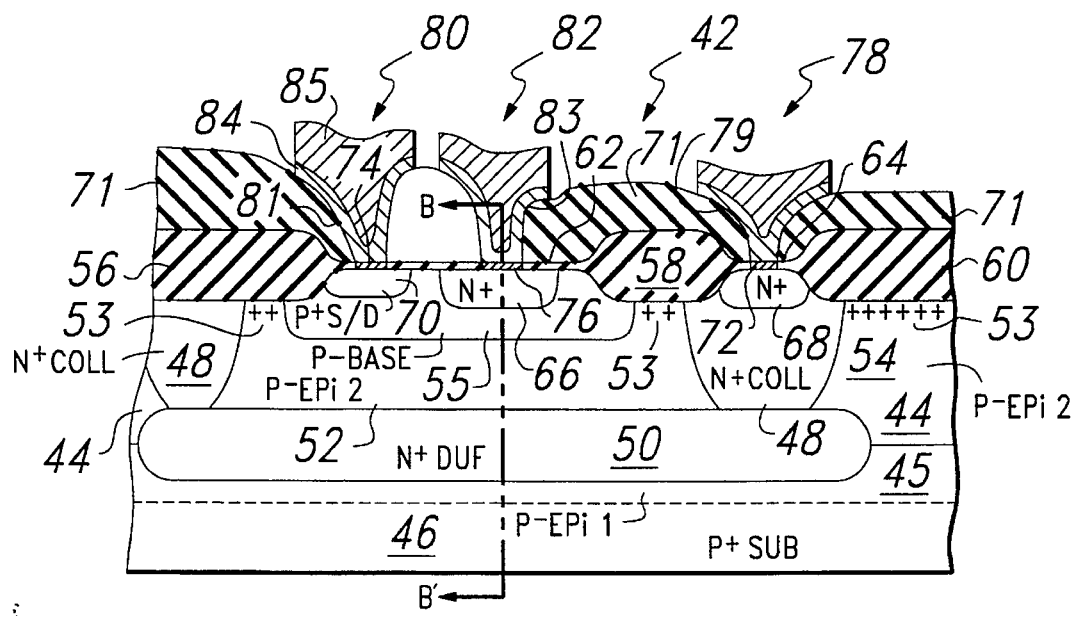
FIG. 5 is a cross-sectional elevation view of an NPN transistor according to a first embodiment of the invention.

FIG. 5 shows a high operating voltage transistor 42 according to a first embodiment of the invention. Transistor 42 is an NPN transistor formed in P– epitaxial layers 44 and 45. Epitaxial layer 44 is formed over epitaxial layer 45 which in turn is formed over P+ substrate 46. Transistor 42 includes an annular N+ collector region 48 that extends through P– epitaxial layer 44 and contacts buried N+ collector layer 50 which is formed at the interface of epitaxial layers 44 and 45.

Annular N+ collector region 48 completely isolates region 52 of P-epitaxial layer 44 from region 54 of P– epitaxial layer 44. Region 52 is that portion of epitaxial layer 44 contained within annular N+ collector region 48. Region 54 is that portion of P– epitaxial layer 44 outside of annular N+ collector region 48. Transistor 42 is fully isolated from any adjacent devices with annular N+ collector region 48 providing lateral isolation and buried N+ collector layer 50 providing vertical isolation.

Transistor 42 also includes a P– base region 55 formed at the face of second P– epitaxial layer 44 in region 52. Field oxide regions 56, 58, and 60 are also formed at the face of second P– epitaxial layer 44 over p channel stop regions 53 (denoted by "+" signs). Transistor 42 also includes an N+ emitter region 66 formed at the face of P– epitaxial layer 44 within base region 55, an N+ collector contact region 68 formed at the face of P– epitaxial layer 44 between field oxide regions 58 and 60 and within annular N+ collector region 48, and a P+ base contact region 70 formed at the face of P-epitaxial layer 44 within base region 55.

A doped glass layer (MLO) 71 extends over field oxide regions 56, 58, and 60 and over thin oxide layers 62 and 64. Collector contact 78 extends through opening 79 in doped glass layer 71 and contacts platinum silicide layer 72 formed at the face of collector contact region 68. Base contact 80 extends through opening 81 in doped glass layer 71 and contacts platinum silicide layer 74 formed at the face of base contact region 70. Emitter contact 82 extends through opening 83 in doped glass layer 71 and contacts platinum silicide layer 76 formed at the face of emitter region 66. Contacts 78, 80, and 82 preferably have a first layer 84 formed of TiW and a second layer 85 of Al-Si-Cu formed over first layer 84.

Figure 6:
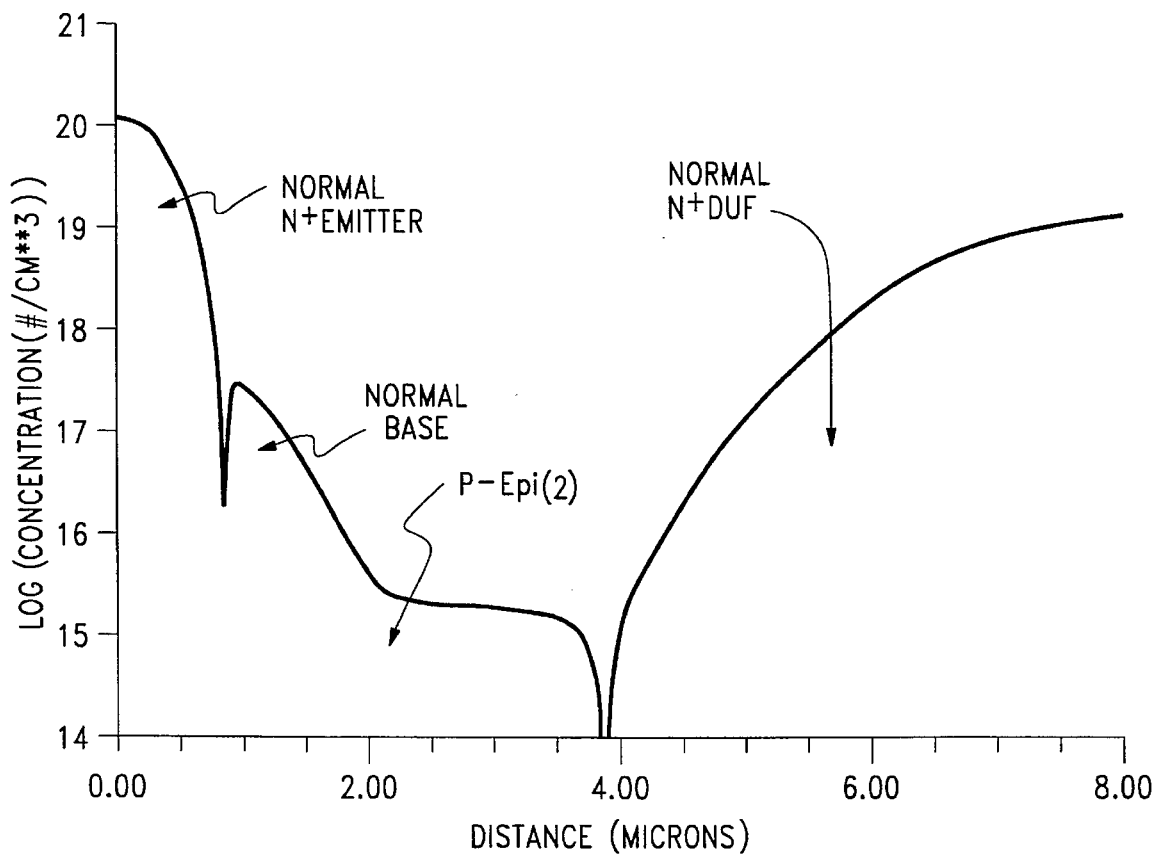
FIG. 6 is a graph showing doping profiles of the emitter, base, second p– epitaxial layer, and N+ buried layer taken along section lines B—B' of the transistor of FIG. 5.

FIG. 6 is a graph showing a suitable doping profile for transistor 42 taken along section lines B—B' of FIG. 5 in terms of concentration in atoms/cm³ versus distance in microns from platinum silicide layer 76 for an epitaxial layer 44 having a thickness of 8.5 microns. As seen in FIG. 6, base region 55 and region 52 of second P– epitaxial layer 44 merge to form an extended base for transistor 42 with a collector-base junction at a depth of 3.8 microns. The reduced doping in P– epitaxial region 52 causes the electric field in the planar base-collector region to be less than that in transistor 10 of FIG. 1. This reduction in electric field in the planar base-collector region leads to an increased valued for the empirical constant n as shown in FIG. 7.

Figure 7:
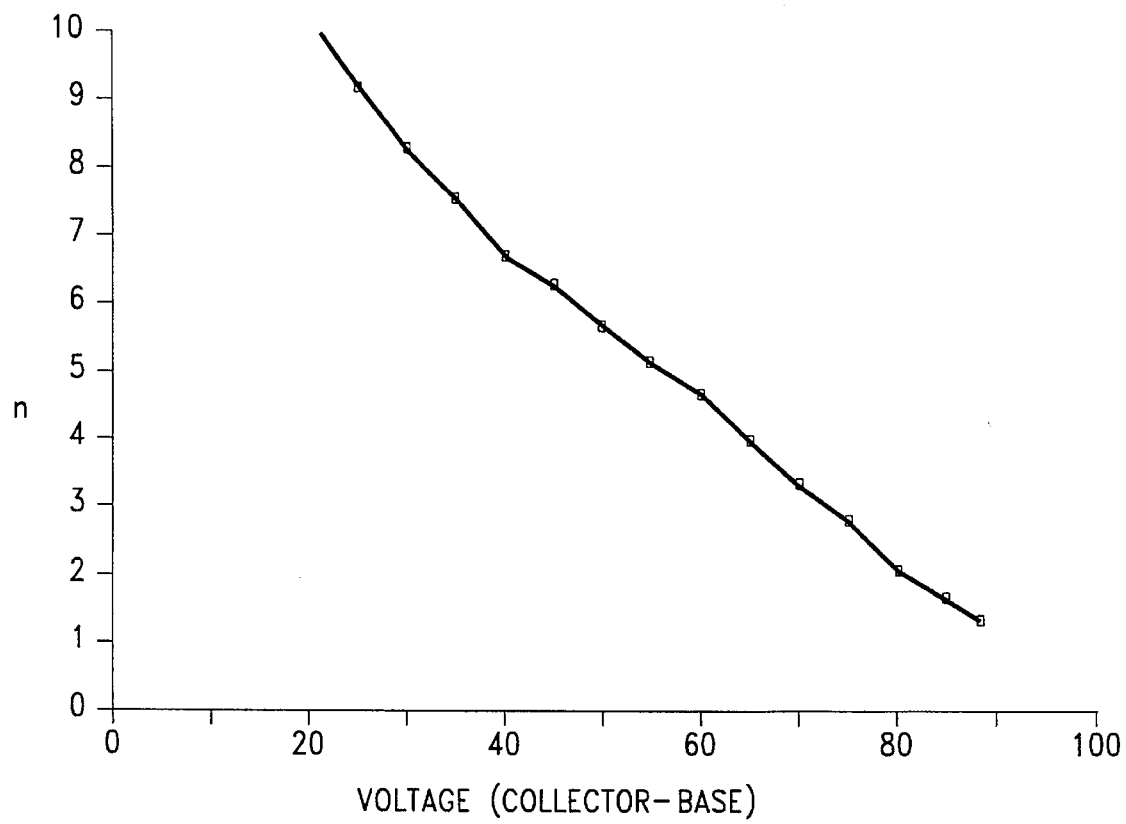
FIG. 7 is a graph showing empirical "n" values as a function of collector-base voltage for the transistor of FIG. 5.

FIG. 7 is a graph illustrating the estimated value of the empirical constant n for transistor 42 of FIG. 5 as a function of collector-base voltage for a base implant dose of 1.0E14 atoms/cmL an Pepi doping of 2.0E15 atoms/cm³, a second epitaxial layer thickness of 8.5 microns, and a pre-epi Si etch of 0.15 microns. For typical collector-base operating voltages in the range of 20–50 volts, the values for the empirical constant n are approximately within the range of 5.8–10.0. This range is significantly higher than the range of 4.8–5.5 shown in FIG. 4 that was achieved using the conventional low dose Nwell implant technique for increasing BVceo breakdown voltage by increasing the value of n.

The increase in BVceo provided by the invention can be illustrated by assuming an estimated value of approximately 6 for empirical constant n together with a typical BVcbo(bulk) of 92 volts. From equation 1, for a typical Hfe with a value of 80, the estimated BVceo breakdown voltage is approximately 40 volts while for an Hfe on the high side with a value of 120, estimated BVceo breakdown voltage is approximately 38 volts. This is an increase in operating voltage (BVceo) of more than 10 volts over that of the conventional NPN transistor of FIG. 1.

Figure 8:
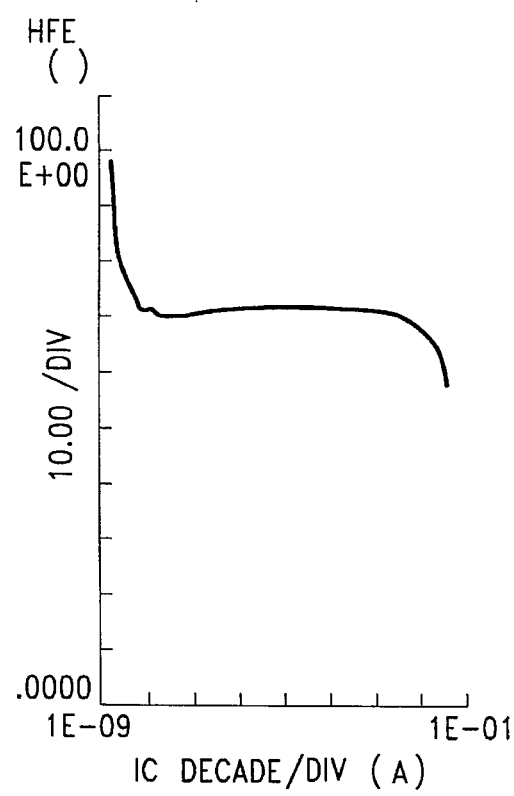
FIG. 8 is a graph showing Hfe as a function of collector current for the transistor of FIG. 5.

FIG. 8 is a graph illustrating the measured value of the current gain, Hfe, for transistor 42 of FIG. 5 as a function of collector current. For normal operating ranges of collector current, the Hfe for transistor 42 is approximately 70. Thus the present invention provides a significant increase in BVceo with Hfe's only about 10% lower than those of standard devices (80).

Figure 9:
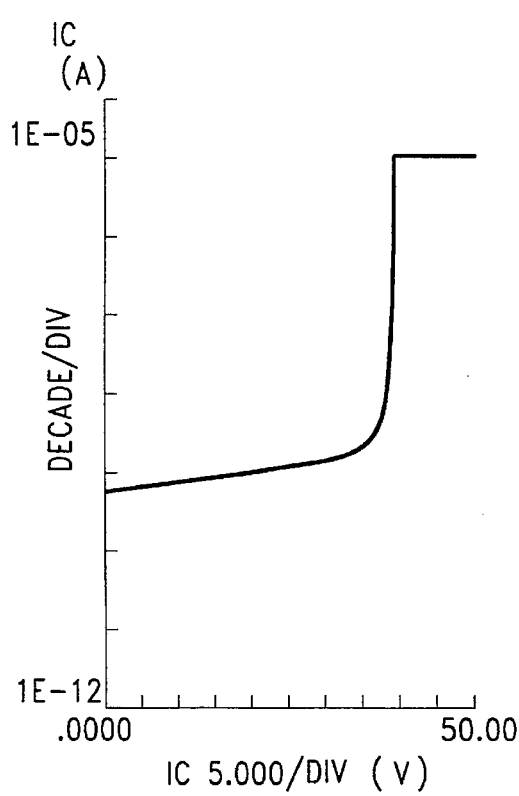
FIG. 9 is a graph showing collector current as a function of collector-emitter voltage for the transistor of FIG. 5.

FIG. 9 is a graph illustrating the measured value of collector current for transistor 42 of FIG. 5 as a function of collector-emitter voltage with the base open. The BVceo breakdown voltage for transistor 42 is approximately 39 volts.

Figure 10A:
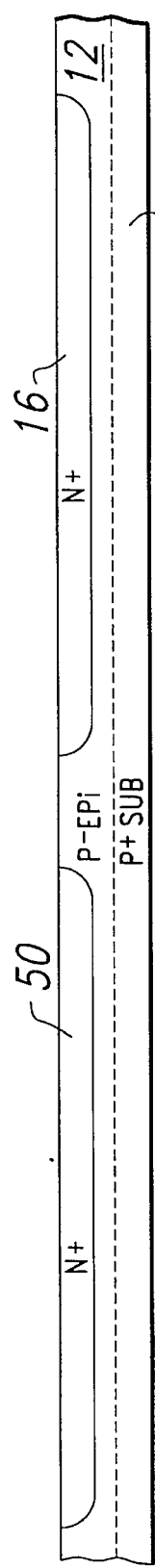
Figure 10B:
Figure 11A:
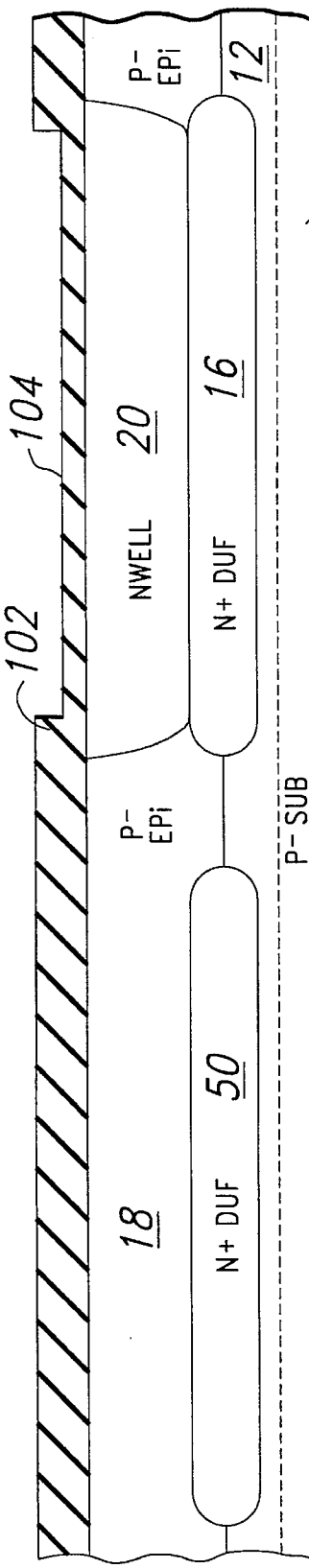
Figure 11B:
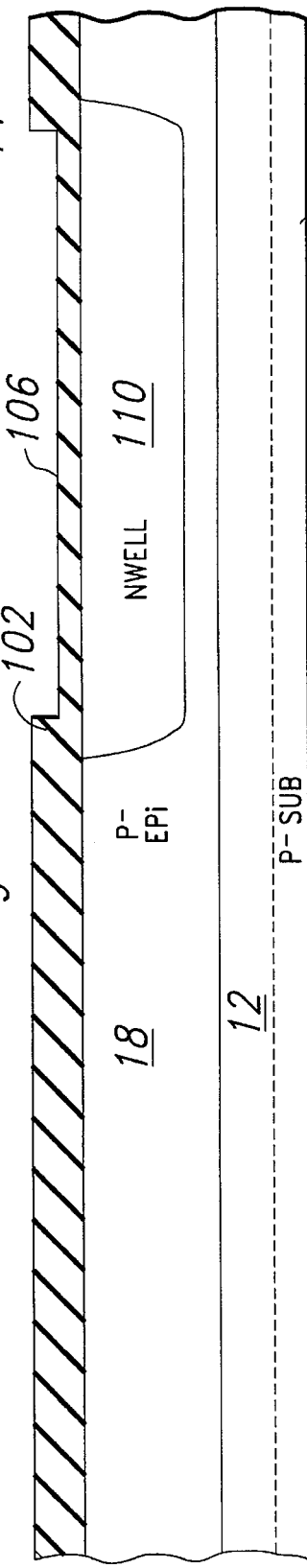
Figure 14A:
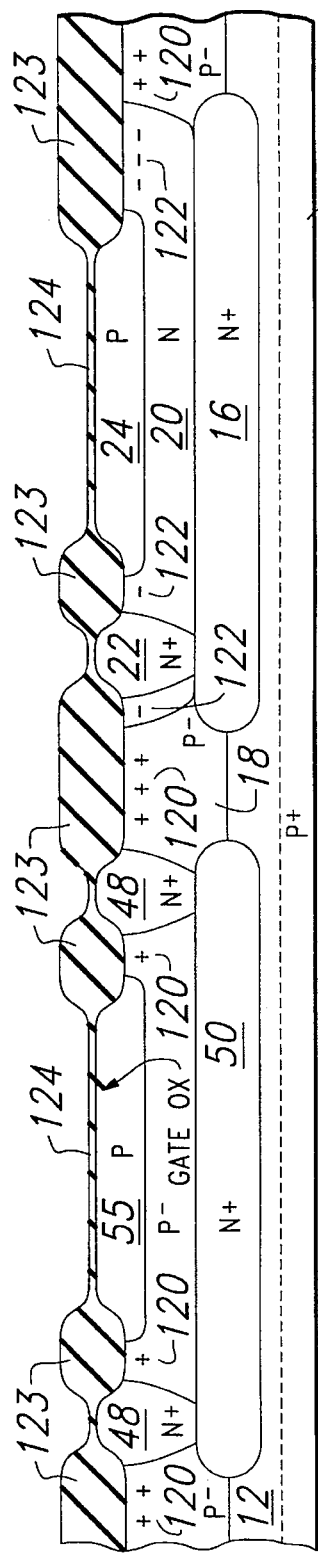
Figure 14B:
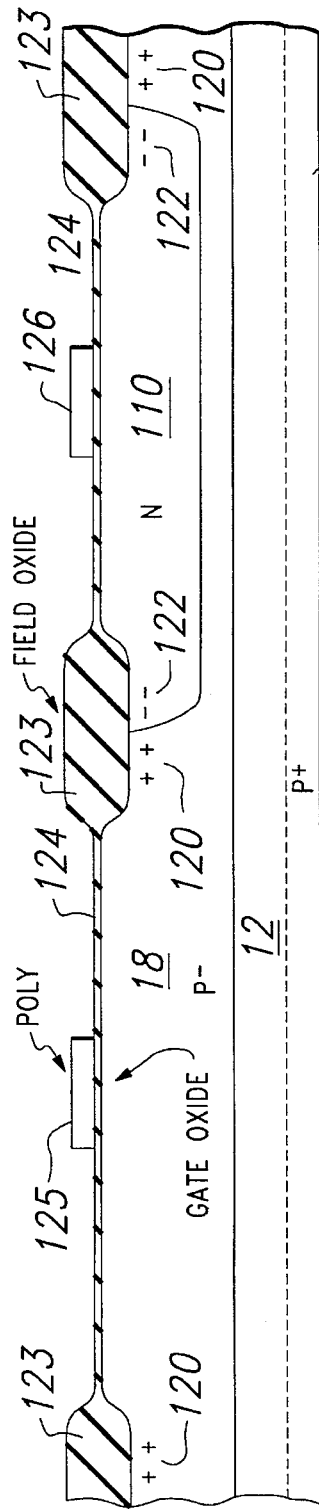
Figure 15A:
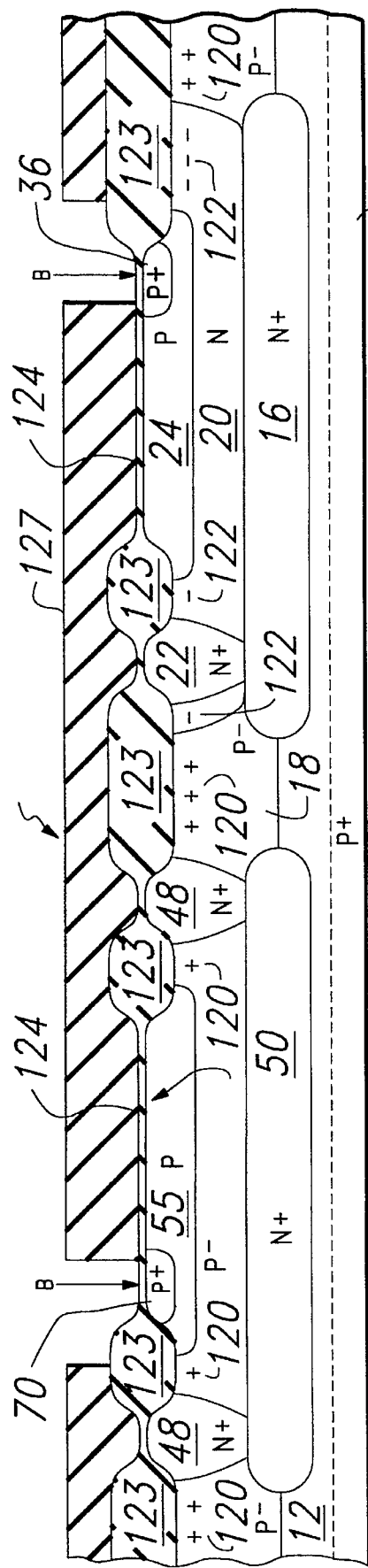
Figure 15B:
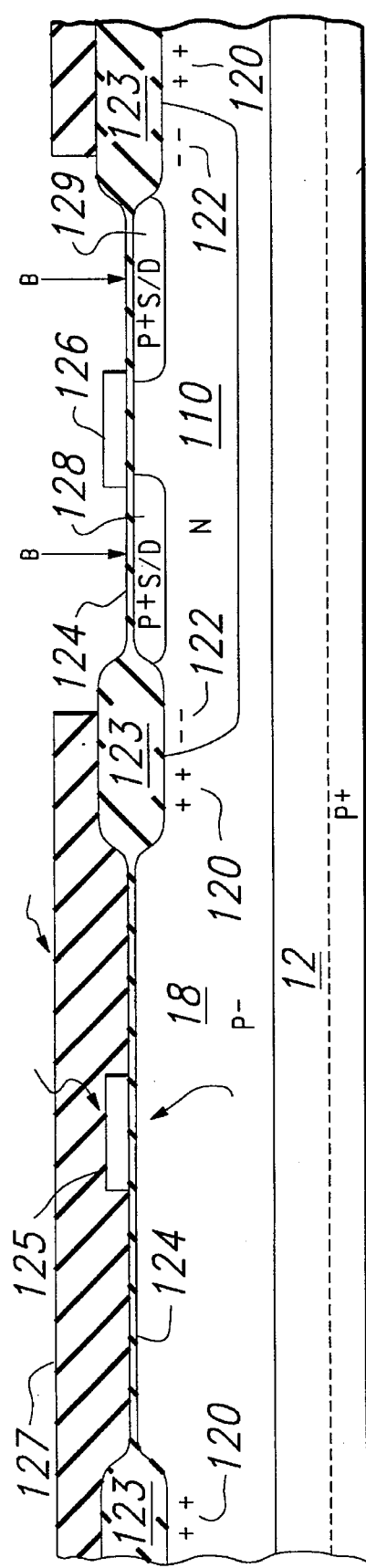
Figure 16A:
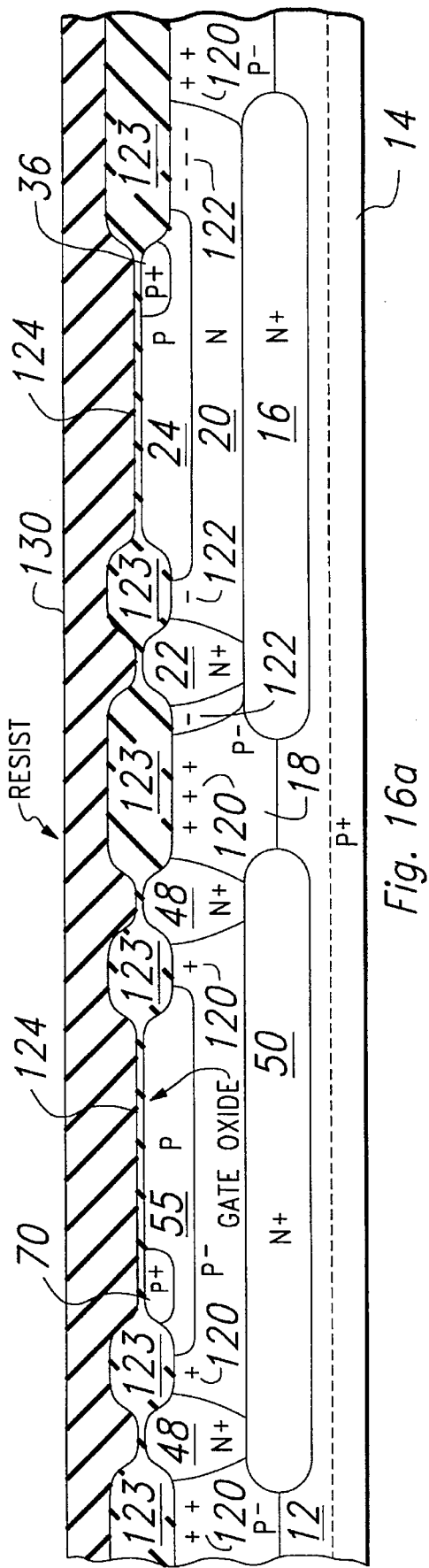
Figure 16B:
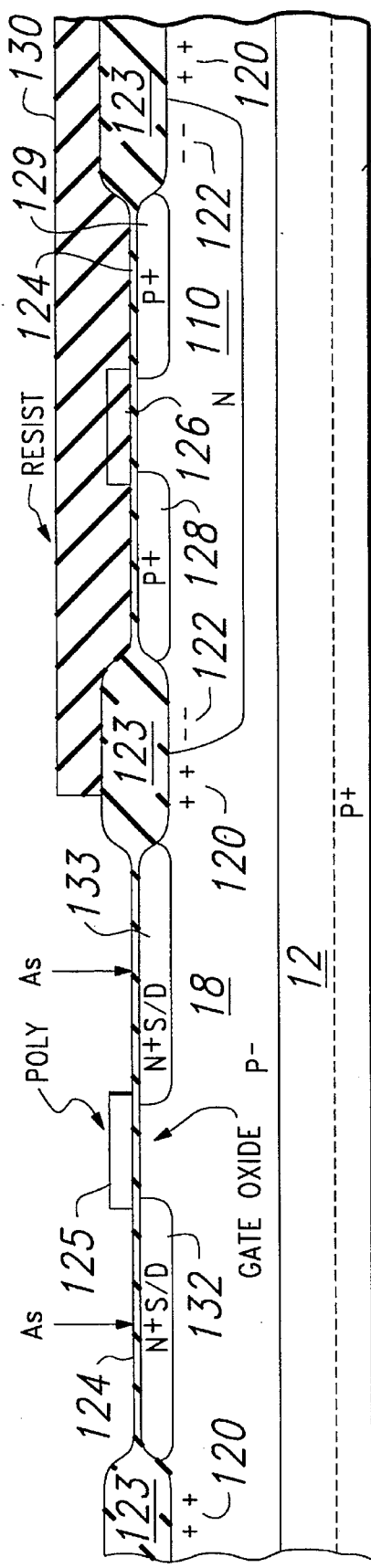
Figure 18A:
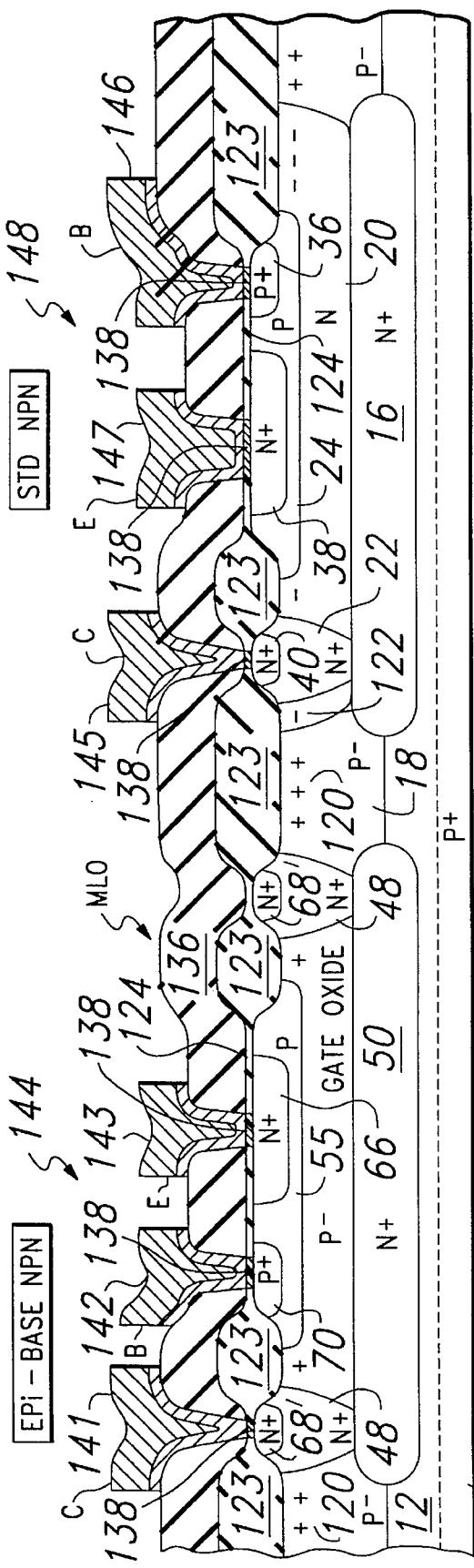
Figure 18B:
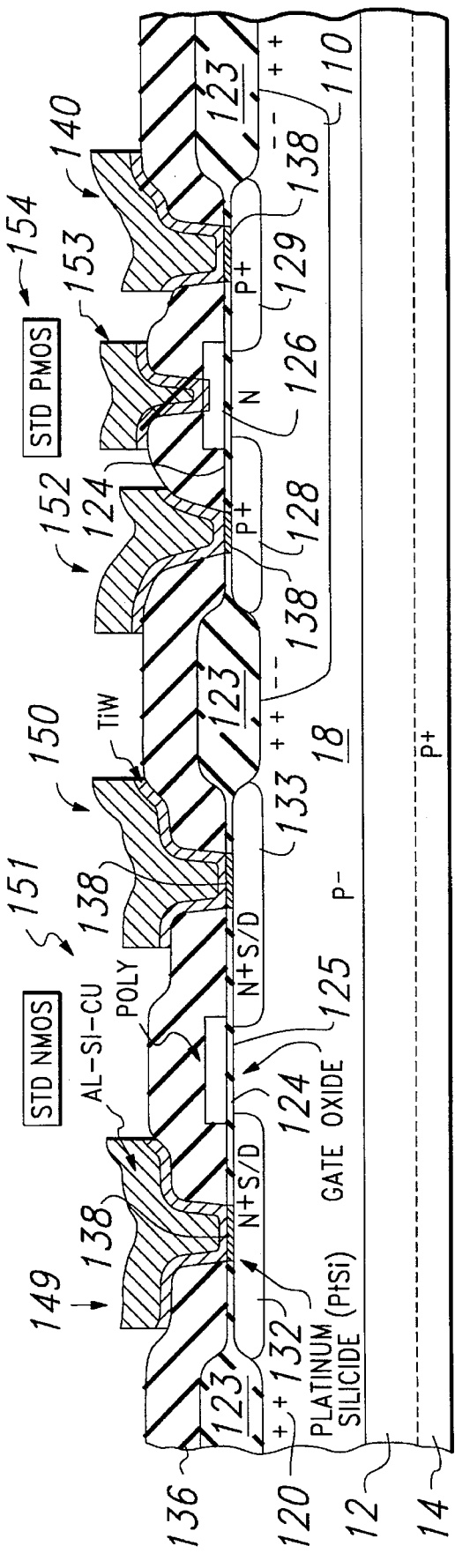

Successive stages in a method of fabricating transistor 42 of FIG. 5 in a BiCMOS device on a wafer having a conventional Nwell NPN transistor and conventional N- and P-channel field effect transistors are shown in cross-sectional elevation views in FIGS. 10a–18b. For each of FIGS. 10a–18b, each Figure labelled "a" shows the bipolar section of the BiCMOS device at a stage in its fabrication and the corresponding Figure labelled "b" shows the CMOS section of the BiCMOS device at the same fabrication stage. Referring to FIGS. 10a and 10b, fabrication of the BiCMOS device begins initially with the formation of first P– epitaxial layer 12 with a thickness of about 20 microns and resistivity of about 6–8 Ω-cm on P+ substrate 14 which has a thickness of about 625 microns and resistivity of about 0.015 Ω-cm. First P– epitaxial layer 12 is then covered with an oxide layer (not shown) which is patterned and etched to expose regions in which buried N+ collector layers will be formed. The exposed regions are then implanted with a dopant, such as antimony with a dose of about 1–6E15 atoms/cm² at 60 keV energy, to form buried N+ collector layers 16 and 50. The remainder of the oxide layer is then removed by an etch, for example, resulting in the structure shown in FIGS. 10a and 10b.

A second P– epitaxial layer 18 having a thickness of about 8.5 microns and resistivity of about 6–8 Ω-cm is then formed over first P– epitaxial layer 12 and buried N+ collector layers 16 and 50. An oxide layer 102 is formed over second P– epitaxial layer 18 and patterned and etched to form windows exposing the surface of epitaxial layer 18 at areas 104 and 106. A dopant, such as phosphorus, is then implanted with a dose of 3.7E12 atoms/cm² at 150 keV in second P– epitaxial layer 18 through windows at areas 104 and 106 to form Nwells 20 and 110. During the diffusion of Nwells 20 and 110, the P+ substrate 14 diffuses upward into first P– epitaxial layer 12; buffed N+ collector layers 16 and 50 diffuse upward into second P– epitaxial layer 18; and oxide layer grows in the windows to form recesses at areas 104 and 106 resulting in the structure shown in FIGS. 11a and 11b.

Oxide layer 102 is patterned and etched to form window 108 and annular window 109 exposing the surface of second P– epitaxial layer 18 to define the locations of an annular N+ collector region and an N+ collector region. A dopant, such as phosphorus, is then implanted or deposited in a furnace in second P– epitaxial layer 18 in the defined collector regions to form annular N+ collector region 48 and N+ collector region 22 resulting in the structure shown in FIGS. 12a and 12b.

Oxide layer 102 is then removed and a pad oxide layer 112 having a thickness of about 500 Angstroms is formed over second P– epitaxial layer 18. A photoresist layer 114 is formed over pad oxide layer 112 and windows 116 and 118 defining base regions are opened in photoresist layer 114 using photolithographic techniques. A boron implant with a dose of about $1.0E14$ atoms/cm$^2$ at approximately 50 keV is performed through windows 116 and 118 to form base regions 24 and 55 in second P– epitaxial layer 18 resulting in the structure shown in FIGS. 13a and 13b.

Photoresist layer 114 is then removed and a nitride layer (not shown) having a thickness of about 1400 Angstroms is formed over pad oxide layer 112 followed by formation of a first photoresist layer (not shown) over the nitride layer. The nitride and first photoresist layers are patterned and etched using photolithographic techniques for all moat regions. A phosphorus channel stop implant is performed with a dose of $1.45E12$ atoms/cm$^2$ at 150 keV into exposed regions of P– epitaxial layer 18 and Nwell regions 22 and 110. With the first photoresist remaining over the nitride layer, a second photoresist layer is deposited and patterned and etched to cover Nwells 22 and 110. A boron implant is then performed with a dose of $3.5E13$ atoms/cm$^2$ at 50 keV into exposed areas in P– epitaxial layer 18. This results in p channel stops 120 (denoted by "+" signs) and n channel stops 122 (denoted by "–" signs) at the surface of second P– epitaxial layer 18.

The photoresist layer is then removed and thick field oxide regions 123 are thermally grown to a thickness of about 12000 Angstroms in the exposed n and p channel stop areas. The remaining portions of the nitride layer and pad oxide layer 112 are then removed by etching. A gate oxide layer 124 is then thermally grown over the face of second epitaxial layer 18 between field oxide regions 123 to a thickness of about 425 Angstroms. A polysilicon layer having a thickness of about 5000 Angstroms is then deposited over gate oxide layer 124 and field oxide regions 123 and doped with an impurity such as phosphorus to render it conductive (about 20 Ω per square). The polysilicon layer is patterned and etched to form gates 125 and 126 for MOS transistors which results in the structure shown in FIGS. 14a and 14b.

A layer of photoresist 127 is then formed on the surface of the wafer and patterned and etched to form windows exposing areas in which a P+ implant is desired. An impurity, such as boron, is then implanted with a dose of $4.0E15$ atoms/cm$^2$ at 40 keV through the windows to form P+ base contact regions 36 and 70 and P+ source/drain regions 128 and 129 which results in the structure shown in FIGS. 15a and 15b.

Photoresist layer 127 is then removed and a new layer of photoresist 130 is then formed on the surface of the wafer and patterned and etched to form windows exposing areas in which N+ source/drain implants are desired. An impurity, such as arsenic, is then implanted with a dose of $8.0E15$ atoms/cm$^2$ at 135 keV through the windows to form N+ source/drain regions 132 and 133 which results in the structure shown in FIGS. 16a and 16b. Although the N+ source/drain implants occur after the P+ source/drain implants in the process flow above, it is understood that the process flow could be modified so that the N+ source/drain implants occur after the P+ source/drain implants.

Photoresist layer 130 is then removed and a new layer of photoresist 134 is then formed on the surface of the wafer and patterned and etched to form windows exposing areas in which a N+ collector contact and emitter implants are desired. An impurity, such as phosphorus, is then implanted with a dose of $5.3E15$ atoms/cm$^2$ at 150 keV through the windows to form annular N+ collector contact region 68', N+ collector contact region 40, emitter region 66, and emitter region 38 which results in the structure shown in FIGS. 17a and 17b.

Photoresist layer 134 is then removed and a doped glass layer (MLO) 136 having a thickness of about 10000 Angstroms is then formed on the surface of the wafer and patterned and etched to form windows extending through gate oxide 124 and exposing contact areas in N+ collector contact regions 68' and 40, N+ emitter regions 66 and 38, P+ base contact regions 70 and 36, N+ source/drain regions 132 and 133, and P+ source/drain regions 128 and 129. A thin film of platinum having a thickness of about 450 Angstroms is then deposited on the contact areas and reacted to form platinum silicide layers 138.

Contacts are then formed by depositing a first metal layer of TiW having a thickness of about 2000 Angstroms over the wafer and then depositing a second metal layer of Al-Si-Cu having a thickness of about 7500 Angstroms over the first metal layer. The first and second metal layers are then patterned and etched to form collector, base, and emitter contacts 141, 142, and 143, respectively, for high voltage NPN extended base transistor 144 according to the invention; collector, base, and emitter contacts 145, 146, and 147, respectively, for conventional Nwell NPN transistor 148; source/drain contacts 149 and 150 for conventional NMOS transistor 151; and source/drain contacts 152 and 153 for conventional PMOS transistor 154. This results in the structure shown in FIGS. 18a and 18b.

As seen in FIGS. 10a–18b, an advantage of the invention is that it allows high-voltage fully isolated NPN transistors such as transistor 144 (which has the same characteristics as transistor 42 of FIG. 5) to be built in a lower-voltage Nwell BiCMOS process. The invention does not require an increase in epitaxial layer thickness or additional processing steps. The invention also does not degrade the performance of any other components on the wafer, does not increase wafer cost, permits use of existing characterized standard cells. The ability to build both high-voltage NPN transistors and conventional low-voltage NPN transistors at the same time is of particular importance for linear ASIC standard cell design strategies in which the process must maintain strict compatibility with previous component types when developing new devices.

Figure 19:
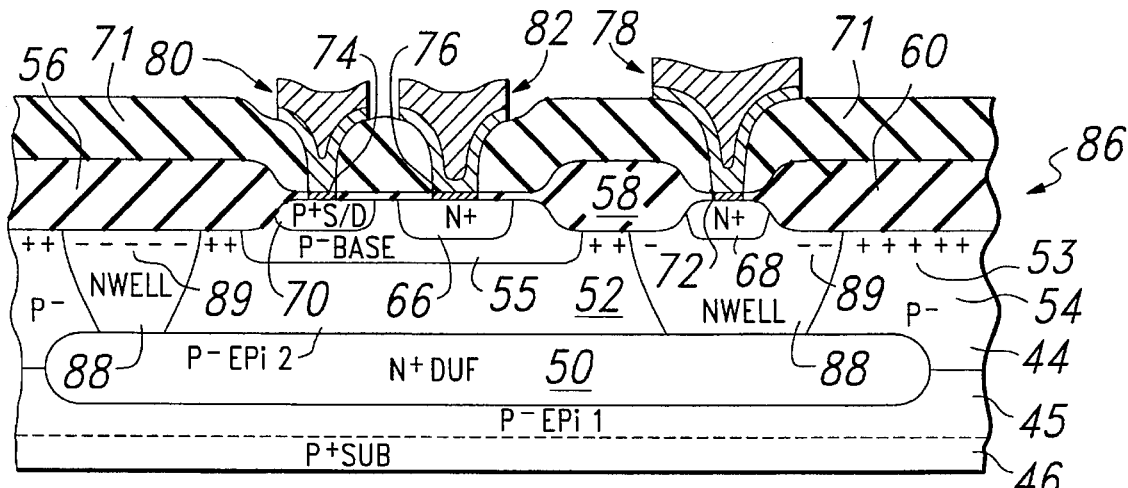
FIG. 19 is a cross-sectional elevation view of an NPN transistor according to a second embodiment of the invention.

FIG. 19 shows a high operating voltage transistor 86 according to a second embodiment of the invention. Transistor 86 is similar to transistor 42 of FIG. 5 with the exception that annular N+ collector region 48 of FIG. 5 is replaced with an annular N collector region 88 in which N channel stops are formed. The use of less heavily doped annular collector region 88 provides an increase in sidewall base-collector breakdown voltage, BVcbo, over that of transistors 10 or 42. N collector region 88 can be formed at the same time as the Nwells for conventional Nwell NPN transistors.

Figure 20:
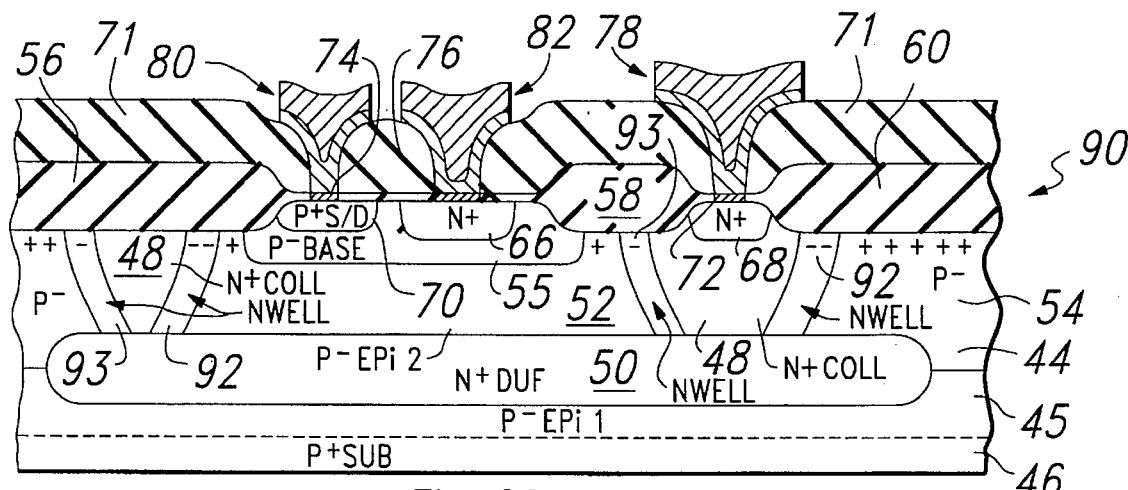
FIG. 20 is a cross-sectional elevation view of an NPN transistor according to a third embodiment of the invention.

FIG. 20 shows a high operating voltage transistor 90 according to a third embodiment of the invention. Transistor 90 is similar to transistor 42 of FIG. 5 with the exception that annular N+ collector region 48 formed within an annular N collector region 92 which has N channel stops 93. N+ collector region 48 is pulled sufficiently inside N collector region 92 so as not to lower the breakdown below that of N collector region 92 alone. The use of a less heavily doped annular collector region between N+ collector region 48 and second epitaxial layer 46 provides an increase in sidewall base-collector breakdown voltage, BVcbo, over that of transistors 10 or 42. N collector region 92 can be formed at the same time as the Nwells for conventional Nwell NPN transistors.

Figure 21:
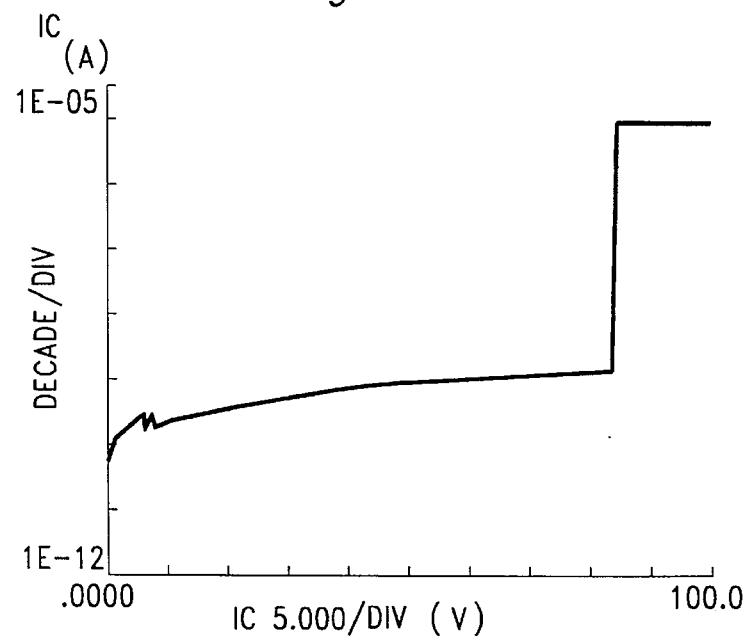
FIG. 21 is a graph showing collector current as a function of collector-emitter voltage for the transistor of FIG. 20.

FIG. 21 is a graph illustrating the value of collector current for transistor 90 of FIG. 20 as a function of collector-base voltage with the emitter open. The BVcbo breakdown voltage for transistor 90 is approximately 83 volts. This is a significant improvement over the normal BVcbo of 50 volts for transistor 10 of FIG. 1.

Figure 22:
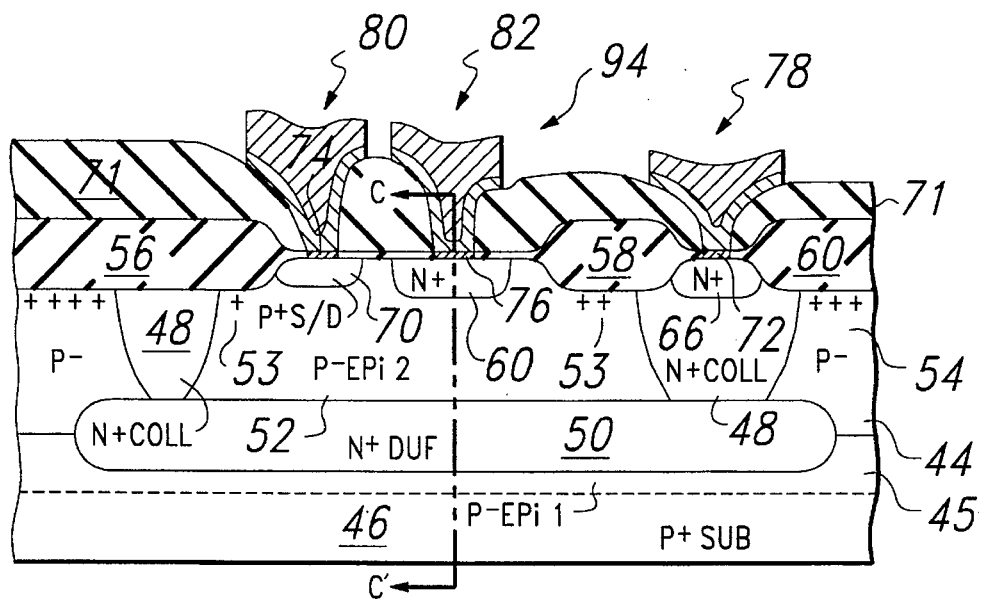
FIG. 22 is a cross-sectional elevation view of an NPN transistor according to a fourth embodiment of the invention.

FIG. 22 shows a super Beta (Hfe) transistor 94 according to a fourth embodiment of the invention. Transistor 94 is similar to transistor 42 of FIG. 5 with the exception that base region 55 is omitted. The base of transistor 94 is thus formed by P– epitaxial region 52.

Figure 23:
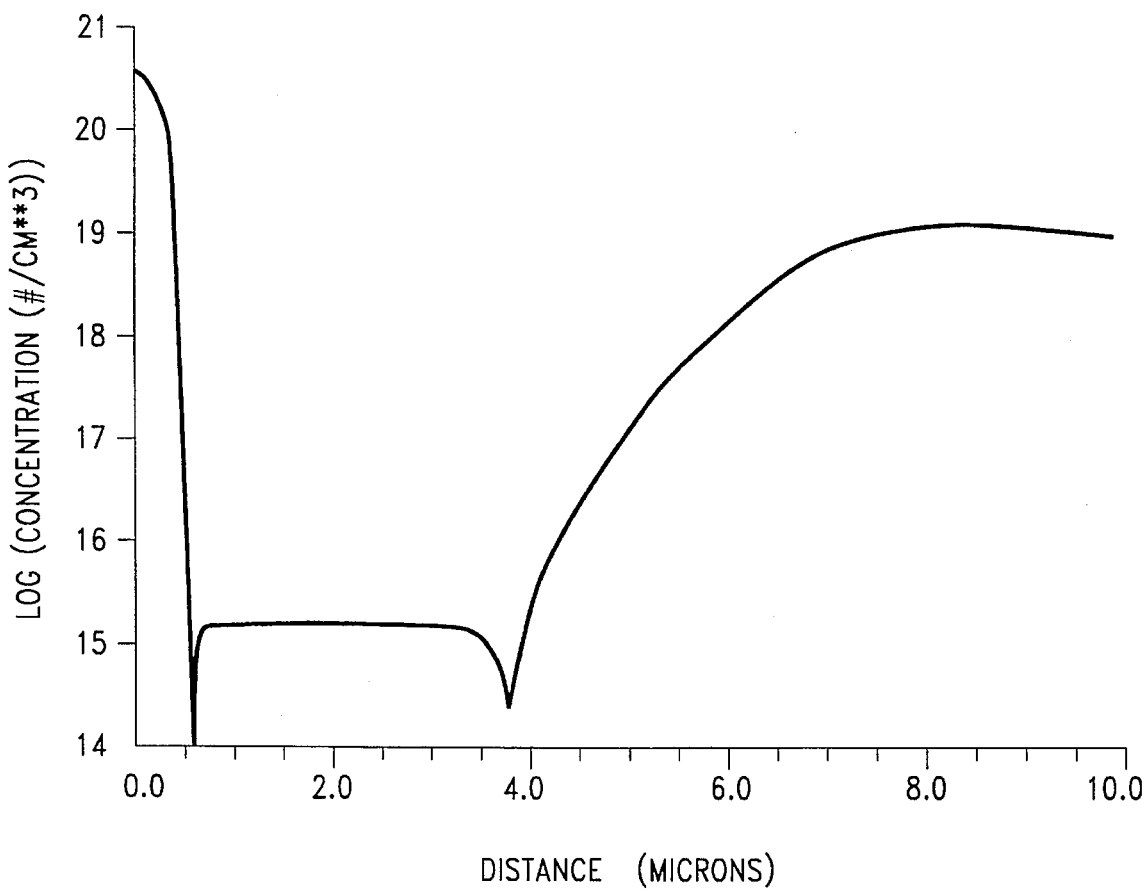
FIG. 23 is a graph showing doping profiles of the emitter, second p-epitaxial layer, and N+ buried layer taken along section lines C—C' of the transistor of FIG. 22.

FIG. 23 is a graph showing a suitable doping profile for transistor 94 of FIG. 22 in terms of concentration in atoms/cm$^3$ versus distance in microns from platinum silicide layer 76 for an epitaxial layer 44 having a thickness of 8.5 microns. The elimination of the normal base diffusion greatly reduces the doping level of the base of transistor 94 which results in a very low integrated charge and a correspondingly high Hfe as shown in FIG. 24.

Figure 24:
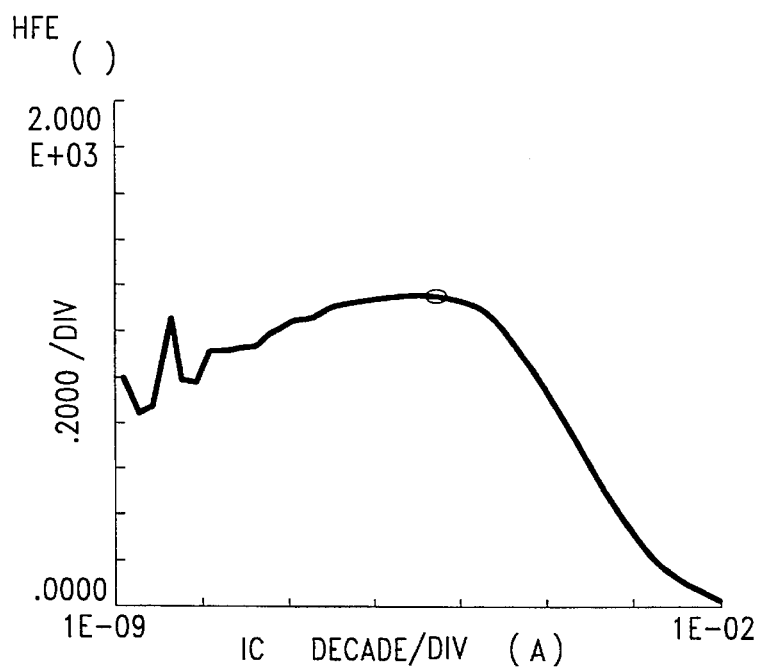
FIG. 24 is a graph showing Hfe as a function of collector current for the transistor of FIG. 23.

FIG. 24 is a graph illustrating the value of the current gain, Hfe, for transistor 94 of FIG. 22 as a function of collector current. For normal operating ranges of collector current, the Hfe for transistor 94 is in the range of approximately 1200–1400. The Hfe values of FIG. 24 were obtained with emitter region 66 of transistor 94 formed with the normal NPN emitter diffusion. In an alternative embodiment, emitter region 66 of transistor 94 could be formed using the NMOS N+ source/drain diffusion which, due to its shallower nature, will yield a super Beta device with a lower Hfe.

Figure 25:
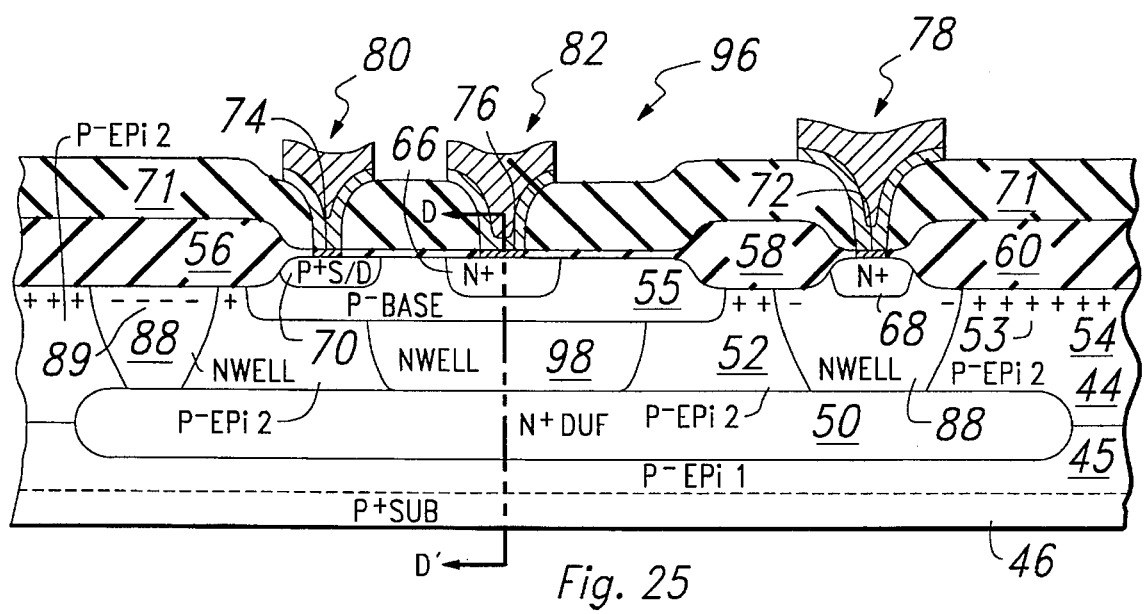
FIG. 25 is a cross-sectional elevation view of an NPN transistor according to a fifth embodiment of the invention.

FIG. 25 shows a transistor 96 according to a fitch embodiment of the invention. Transistor 96 is similar to transistor 86 of FIG. 19 with the exception that an additional N collector region 98 is formed between a portion of base region 55 and a portion of N+ buried collector layer 50. Like annular N collector region 88, N collector region 98 can be formed at the same time as the Nwells for conventional Nwell NPN transistors. Transistor 96 has a vertical doping profile along section lines D—D' that matches the doping profile of transistor 10 of FIG. 1 as shown in FIG. 2. As a result, transistor 96 has BVceo characteristics similar to transistor 10. However, since P– base region 55 extends over and contacts both N collector region 98 and region 52 of P– epitaxial layer 44 transistor 96 has high BVcbo breakdown voltage values that are useful in transient protection circuits used in automotive and other mixed-signal applications where harsh transients can be present. The high BVcbo values are the result of P– base region 55 extending outside N collector region 98 and being in electrical contact with the lightly doped P– epitaxial region 52. This causes the value of BVcbo to be driven by the breakdown of the junction between annular N collector region 88 and P– epitaxial region 52.

Figure 26:
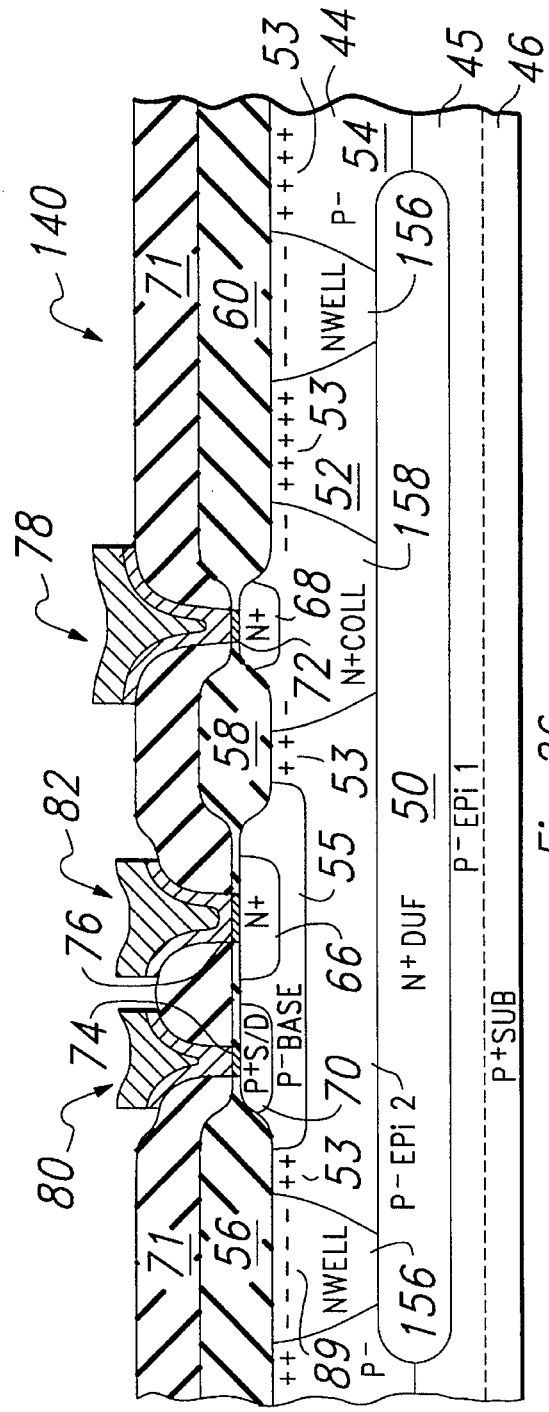
FIG. 26 is a cross-sectional elevation view of an NPN transistor according to a sixth embodiment of the invention.

FIG. 26 shows a high operating voltage transistor 140 according to a sixth embodiment of the invention. Transistor 140 is similar to transistor 86 of FIG. 19 with the exception that the annular N region 156 that provides lateral isolation for transistor 140 is buried under field oxide regions 56 and 60. Collector contact for the transistor is provided by a separate slug-shaped N+ collector region 158 formed within P– epitaxial region 52. N+ collector contact 68 is formed at the surface of N+ collector region 142.

Figure 27:
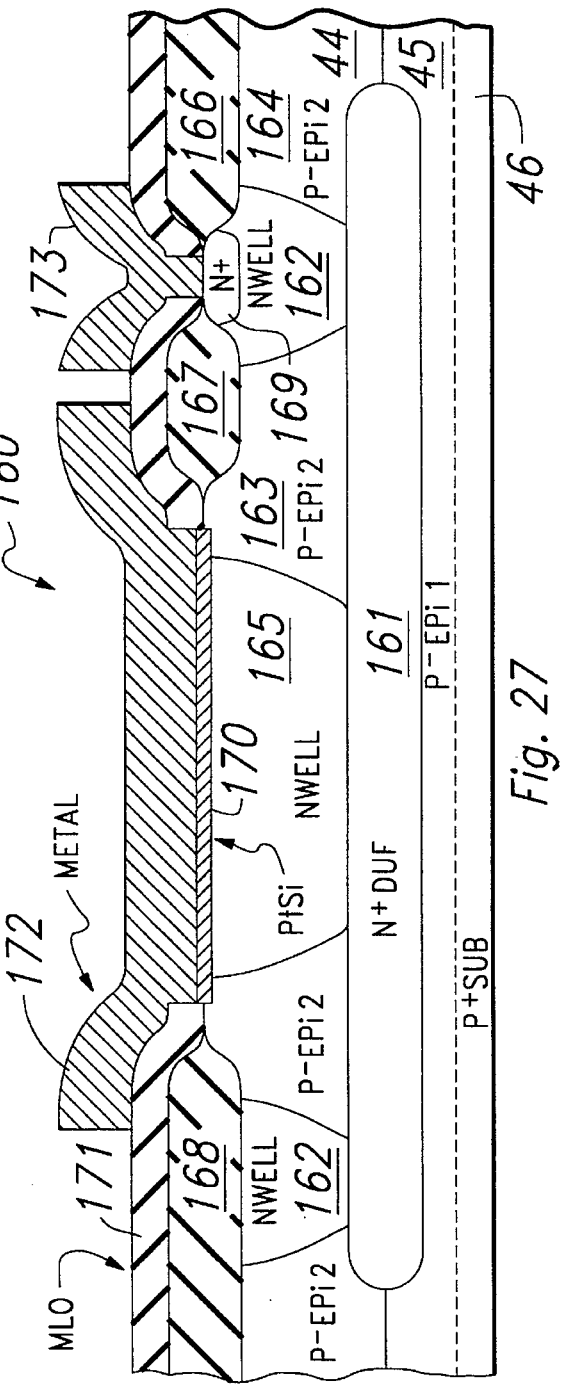
FIG. 27 is a cross-sectional elevation view of a Schottky diode according to a seventh embodiment of the invention.

FIG. 27 shows high voltage Schottky diode 160 according to a seventh embodiment of the invention. Schottky diode 160 includes an N+ buried layer 161 formed at the interface between a lightly doped layer, first P– epitaxial layer 45, and second P– epitaxial layer 44. First P– epitaxial layer 45 is formed over P+ substrate 46 and second P– epitaxial layer 44 is formed over first P-epitaxial layer 44. An annular N region 162 is formed that extends through second P– epitaxial layer 44 and contacts N+ buried layer 161. Annular N region 162 isolates region 163 of second P– epitaxial layer 44 from region 164 of second P– epitaxial layer 44. Region 163 of second P– epitaxial layer 44 in turn acts as a guard ring for Schottky diode 160.

An N region 165, which is the anode region of Schottky diode 160, is formed through region 163 in contact with N+ buried layer 161. Regions 162 and 165 may be formed simultaneously during the formation of Nwells in a BiCMOS process. Field oxide regions 166, 167, and 168 are formed at the surface of epitaxial layer 44. An N+ contact region 169 is formed in annular N region 162 between field oxide regions 166 and 167. A cathode 170, preferably formed of a layer of platinum-silicide, is formed in contact with the surface of N region 165 and the surface of region 163 of second P– epitaxial layer 44. Materials other than platinum-silicide, including other silicides and metals such as Al or Ti may also be used as the cathode. A doped glass layer (MLO) 171 is formed over the surface of the device with metal contacts 172 and 173 extending through openings in layer 171 to contact Pt-Si layer 170 and N+ contact region 169, respectively.

Conventional Schottky diodes use a P+ source/drain diffusion or a P+ base diffusion to form the guard ring. With a P+ source/drain diffusion guard ring the reverse breakdown voltage is about 15 volts. With a P+ base diffusion guard ring the reverse breakdown voltage is about 40 volts. The use of lightly doped P– epitaxial region 163 as the guard ring in Schottky diode 160 with Pt-Si layer 170 extending over and contacting both P– epitaxial region 163 and N region 165 provides a reverse breakdown voltage of about 85 volts. The high breakdown voltages achieved by the Schottky diode 160 in accordance with the invention are the result of Pt-Si layer 170 extending outside N region 165 and being in electrical contact with the lightly doped P– epitaxial region 163. This causes the value of the breakdown voltage to be driven by the breakdown of the junction between annular N region 162 and P– epitaxial region 163.

A few preferred embodiments have been described in detail hereinabove. It is to be understood that the scope of the invention also comprehends embodiments different from those described, yet within the scope of the claims.

For example, the conductivity types of all regions in bipolar transistors according to the invention can be switched so that all p regions become n regions and all n regions become p regions to form PNP transistors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A Schottky diode, comprising:

a lightly doped layer of semiconductor material of a first conductivity type;

an anode region of semiconductor material of a second conductivity type opposite said first conductivity type formed in said lightly doped layer;

a cathode formed over and contacting said anode region and said lightly doped layer;

a buried layer of semiconductor material of said second conductivity type, said lightly doped layer formed over said buried layer; and an annular region of semiconductor material of said second conductivity type, said annular region extending through said lightly doped layer and contacting said buried layer, said buried layer and said annular region for isolating said Schottky diode.

2. The Schottky diode of claim 1 in which said lightly doped layer is an epitaxial layer.

3. The Schottky diode of claim 1 in which said cathode is a metal.

4. The Schottky diode of claim 1 in which said cathode is a silicide.

5. The Schottky diode of claim 1 in which said first conductivity type is P and said second conductivity type is N.

* * * * *